United States Patent
Lee et al.

(10) Patent No.: US 9,891,361 B2
(45) Date of Patent: Feb. 13, 2018

(54) ORGANIC LIGHT EMITTING DISPLAY DEVICE AND METHOD OF MANUFACTURING THE SAME

(75) Inventors: Jae-Young Lee, Daejeon (KR);
Won-Jae Yang, Gimpo-si (KR);
Myung-Seop Kim, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 998 days.

(21) Appl. No.: 13/492,263

(22) Filed: Jun. 8, 2012

(65) Prior Publication Data

US 2013/0032830 A1 Feb. 7, 2013

(30) Foreign Application Priority Data

Aug. 5, 2011 (KR) .......... 10-2011-0078059
May 11, 2012 (KR) .......... 10-2012-0050341

(51) Int. Cl.
*H01L 51/00* (2006.01)
*G02B 5/30* (2006.01)
*H01L 51/52* (2006.01)

(52) U.S. Cl.
CPC ........ *G02B 5/3041* (2013.01); *H01L 51/5256* (2013.01); *H01L 51/5281* (2013.01)

(58) Field of Classification Search
CPC .................. H01L 51/5281; H01L 51/5256
See application file for complete search history.

(56) References Cited

U.S. PATENT DOCUMENTS 7,545,570 B2 * 6/2009 Crouch .......... 359/629

| | | |
|---|---|---|
| 2004/0212606 A1 | 10/2004 | Miyachi et al. |
| 2006/0022592 A1 | 2/2006 | Boroson |
| 2009/0072735 A1 | 3/2009 | Tsukahara et al. |

FOREIGN PATENT DOCUMENTS

| | | |
|---|---|---|
| CN | 1992336 A | 7/2007 |
| CN | 101019249 A | 8/2007 |
| CN | 101097946 A | 1/2008 |
| CN | 101106181 A | 1/2008 |
| CN | 101393969 A | 3/2009 |
| EP | 2 141 754 A1 | 1/2010 |
| EP | 2 163 380 A1 | 1/2010 |
| EP | 2163380 A1 | 3/2010 |
| KR | 10-2007-0116480 A | 12/2007 |
| KR | 10-2008-0006922 A | 1/2008 |
| WO | WO 2005/093906 A1 | 10/2005 |
| WO | WO 2006/036393 A2 | 4/2006 |

OTHER PUBLICATIONS

Machine translation of KR-10-2008-0006922, part of Applicant's IDS, by Song et al, 28 pages.*
Machine translation of KR-10-2007-0116480, part of Applicant's IDS, by Ahn et al, 8 pages.*

* cited by examiner

*Primary Examiner* — Kimberly Rizkallah
*Assistant Examiner* — Alexander Belousov
(74) *Attorney, Agent, or Firm* — Birch, Stewart, Kolasch & Birch, LLP

(57) ABSTRACT

Discussed are an organic light emitting display device and a method of manufacturing the same in which organic and inorganic films are formed on a polarization plate, and the polarization plate is attached to an organic light emitting panel so that the organic and inorganic films seal the organic light emitting panel, thereby achieving improved polarization and a simple sealing structure.

18 Claims, 7 Drawing Sheets

ORGANIC LIGHT EMITTING DISPLAY DEVICE AND METHOD OF MANUFACTURING THE SAME

CROSS REFERENCE TO RELATED APPLICATION

This application claims priority to and the benefit of Korean Patent Application No. 10-2011-0078059, filed on Aug. 5, 2011 and Korean Patent Application No. 10-2012-0050341, filed on May 11, 2012, which are hereby incorporated by reference as if fully set forth herein.

BACKGROUND OF THE INVENTION

Field of the Invention

Embodiments of invention relate to an organic light emitting display device and a method of manufacturing the same, and, in particular, to an organic light emitting display device and a method of manufacturing the same in which organic and inorganic thin films are formed on a polarization plate, and the polarization plate is attached to an organic light emitting panel so that the organic and inorganic thin films seal the organic light emitting panel, thereby achieving improved polarization and a simple sealing structure.

Discussion of the Related Art

An image display device to visually provide a variety of information increasingly becomes a core technology in communication and thus has been developed to be thinner and more lightweight to achieve improved portability while maintaining high performance. As a flexible display device bendable for effective space utilization and convenience is increasingly demanded, organic light emitting display devices are receiving much attention recently.

An organic light emitting display device may include an organic light emitting element array, each organic light emitting element of the array including an anode, an organic light emitting layer and a cathode disposed in this order on a substrate, and a capping layer to cap the organic light emitting element array.

The organic light emitting element operates as follows. When an electric field is applied between the anode and cathode respectively formed on both of opposite surfaces of the organic light emitting layer, holes and electrons are injected into the organic light emitting layer, and then are combined with each other, thus generating light emission. That is, in the organic light emitting layer, when the holes and electrons are combined with each other, an energy state thereof changes from an excitation state to a lower state, resulting in light emission.

The organic light emitting display device may advantageously be provided in a thin film form. However, the organic light emitting display device may suffer from not only deterioration caused by intrinsic factors, such as deterioration of the electrodes and light emitting layer due to oxygen and deterioration due to a reaction between the light emitting layer and an interface, but also deterioration caused by extrinsic factors such as effect of moisture, oxygen, or ultra-violet light, etc. For this reason, as to the organic light emitting display device, a packaging and/or encapsulation process may be important.

As to the organic light emitting display device, the encapsulation process may include a sealing process to dispose a cover substrate over a substrate having an organic light emitting layer formed thereon and provide a sealant at a peripheral inner surface of the cover substrate. Alternatively, the encapsulation process may include a sealing process to form alternate organic and inorganic thin films on a substrate having an organic light emitting layer formed thereon.

Now, a conventional encapsulation process will be described with reference to FIG. 1.

FIG. 1 is a cross-sectional view of an organic light emitting display device of a related art.

As shown in FIG. 1, a thin film transistor array 20 is disposed on a glass substrate 10, an organic light emitting element array 30 is disposed on the thin film transistor array 20, and an opposing glass substrate 40 is disposed on the organic light emitting element array 30.

A sealant is formed at a peripheral inner surface of the glass substrate or the opposing glass substrate 40 to seal the thin film transistor array 20 and the organic light emitting element array 30. Thus, the thin film transistor array 20 and the organic light emitting element array 30 may be protected from moisture and/or impact.

Further, a polarization plate 50 may be disposed over the opposing glass substrate 40 with an adhesive layer interposed therebetween, to prevent ambient or external light incident upon the organic light emitting display device from being reflected therefrom.

The organic light emitting display device may have the following problem.

The method of sealing the thin film transistor array 20 and the organic light emitting element array 30 using the opposing glass substrate 40 and the sealant may not be applied to on-demand flexible display devices because the opposing glass substrate 40 may not be bendable due to thickness thereof.

Therefore, as to the organic light emitting display device, the latter encapsulation process, that is, the sealing process to form alternate organic and inorganic thin films on a substrate having an organic light emitting layer formed thereon has been employed.

However, as to the latter encapsulation process, in addition to the alternate organic and inorganic thin films, a plastic film is required as a base substrate. The plastic film optically has an anisotropic property whereas the glass substrate optically has an isotropic property. Therefore, when external light is incident upon the organic light emitting display device, polarization may not operate as appropriate and thus external light may be reflected from the organic light emitting display device, so that external light is disadvantageously visible to a viewer of the organic light emitting display device. Further, since phase of light has been changed due to the thin films such as the plastic film added in the sealing process, arrangement of the thin films is required in consideration of the phase of light.

SUMMARY OF THE INVENTION

Accordingly, the invention is directed to an organic light emitting display device and a method of manufacturing the same that substantially obviates one or more problems due to limitations and disadvantages of the related art.

An object of the invention is to provide an organic light emitting display device and a method of manufacturing the same in which organic and inorganic films are formed on a polarization plate, and the polarization plate is attached to an organic light emitting panel so that the organic and inorganic films seal the organic light emitting panel, thereby achieving improved polarization and a simple sealing structure.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method of manufacturing an organic light emitting display device includes forming an organic light emitting element array on a substrate; forming, on a first surface of a quarter wave plate, a first thin-film stacked structure of at least one organic film and at least one inorganic film, the at least one organic film and the at least one inorganic film being disposed one on top of the other; adhering the first thin-film stacked structure on the substrate using an adhesive layer so that the first thin-film stacked structure and the organic light emitting element array face each other; and attaching a linear polarization layer on a second surface of the quarter wave plate opposite the first second surface, to form a polarization plate including the quarter wave plate and the linear polarization layer.

Attaching the linear polarization layer may include disposing the linear polarization layer on the quarter wave plate so that an absorption axis of the linear polarization layer is at +45° or −45° angle with respect to a slow axis of the quarter wave plate.

The method may further include forming a second thin-film stacked structure between the quarter wave plate and the linear polarization layer, the second thin-film stacked structure being formed of at least one organic film and at least one inorganic film, the at least one organic film and the at least one inorganic film of the second thin-film stacked structure being disposed one on top of the other.

Forming the first thin-film stacked structure may include vaporizing and coating an organic solvent on the first surface of the quarter wave plate; curing the organic solvent to form an organic film; and depositing an inorganic film on the organic film.

Forming the first thin-film stacked structure may be carried out in a state in which the quarter wave plate is wound around a roll.

Forming the linear polarization layer may further include providing an adhesive layer between the second surface of the quarter wave plate and the linear polarization layer.

In accordance with another aspect of the invention, an organic light emitting display device includes a substrate; an organic light emitting element array disposed on the substrate; a polarization plate disposed over the organic light emitting element array and including a first thin-film stacked structure formed of at least one organic film and at least one inorganic film, the at least one organic film and the at least one inorganic film being disposed one on top of the other; and an adhesive layer disposed between the substrate and the polarization plate, wherein the adhesive layer covers the organic light emitting element array.

The polarization plate may further include a second thin-film stacked structure disposed on an opposite side of the polarization plate from the first thin-film stacked structure, and formed of at least one organic film and at least one inorganic film, the at least one organic film and the at least one inorganic film of the second thin-film stacked structure being disposed one on top of the other.

The polarization plate may further include a second thin-film stacked structure formed of at least one of an organic film or an inorganic film.

The polarization plate may include a quarter wave plate (λ/4 plate) disposed on the first thin-film stacked structure; and a linear polarization layer disposed on the quarter wave plate.

The organic film of the first thin-film stacked structure may be in contact with the quarter wave plate.

The first thin-film stacked structure may face the organic light emitting element array.

The polarization plate may further include a second thin-film stacked structure disposed between the quarter wave plate and the linear polarization layer, wherein the second thin-film stacked structure is formed of at least one organic film and at least one inorganic film, the at least one organic film and the at least one inorganic film of the second thin-film stacked structure are disposed one on top of the other.

The polarization plate may further include a second thin-film stacked structure disposed between the quarter wave plate and the linear polarization layer, wherein the second thin-film stacked structure is formed of at least one of an organic film or an inorganic film.

A total thickness including the quarter wave plate and the first thin-film stacked structure is about 50 μm to 80 μm.

An absorption axis of the linear polarization layer may be at +45° or −45° angle with respect to a slow axis of the quarter wave plate.

The quarter wave plate may be formed of a stack consisting of two eighth wave plates (λ/8 plates).

The quarter wave plate may be made of a material having a reflection rate equal to or less than 5% in a wavelength range of 400 nm to 500 nm.

A retardation value of the quarter wave plate is in a range of 138 nm to 148 nm.

The substrate comprises any one of a plastic thin film, a thin film glass and a metal foil, each having a thickness equal to or less than 0.2 mm.

The quarter wave plate has a moisture permeability equal to or less than $10^{-3}$ g/m²·day.

The substrate may be flexible.

In accordance with another aspect of the invention, an organic light emitting display device includes a substrate; an organic light emitting element array disposed on the substrate; a polarization plate disposed over the organic light emitting element array and including a circular polarizer and a first thin-film stacked structure formed of at least one of an organic film and an inorganic film; and an adhesive layer disposed between the substrate and the polarization plate, wherein the adhesive layer covers the organic light emitting element array.

The polarization plate may further include a transparent optical film. The transparent optical film may be polyethylene terephthalate (PET).

The organic light emitting display device and the method of manufacturing the same in accordance with the invention have the following effects.

First, a plastic thin film having an anisotropic property is excluded in a sealing process, and sealing organic and inorganic thin films are formed on one side surface or both side surfaces of a retarder of a polarization plate, and the polarization plate is attached to a substrate on which an organic light emitting element array is formed, with an adhesive layer interposed therebetween, to encapsulate the organic light emitting element array. Since the plastic thin film having an anisotropic property is absent at an interface between the polarization plate and the substrate, external light is not visible to a viewer of the display device. That is, the sealing organic and inorganic thin films are formed to be integrated with the polarization plate, and, thus, additional plastic thin film except the sealing organic and inorganic thin films may be eliminated at an interface between the organic light emitting element array and the polarization plate. As a result, a polarization characteristic to the external light may be valid.

Second, the sealing organic and inorganic thin films are formed to be integrated with the polarization plate and, thus, additional film necessary in the encapsulation process of a related art may be eliminated. Further, a glass substrate may be eliminated which is necessary in the above-described encapsulation process using the glass. Therefore, the display device has a greatly-reduced thickness, to provide the display device with improved bendability.

Third, since the sealing organic and inorganic thin films are formed to be integrated with a quarter wave plate (retarder) of the polarization plate, a sealing structure may be simplified. That is, the sealing organic and inorganic thin films are formed on the quarter wave plate in a roll to roll manner, to allow an adhesive layer to be eliminated between the quarter wave plate and the sealing organic and inorganic thin films and, further, the additional film necessary in the encapsulation process of a related art may be eliminated, thereby achieving a simple encapsulation structure.

Fourth, the sealing organic and inorganic thin films are formed to be integrated with the polarization plate, to allow the polarization characteristics of the polarization plate to be maintained. Therefore, an ambient contrast ratio (ACR) may be ensured to have a sufficient level, so that, when ambient or external light is present, the display device may maintain high visual performance.

It is to be understood that both the foregoing general description and the following detailed description of the invention are example and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the invention, examples of which are illustrated in the accompanying drawings. Wherever possible, the same reference numbers will be used throughout the drawings to refer to the same or like parts.

Hereinafter, an organic light emitting display device and a method of manufacturing the same according to example embodiments of the invention will be described in detail with reference to the accompanying drawings.

Figure 1:
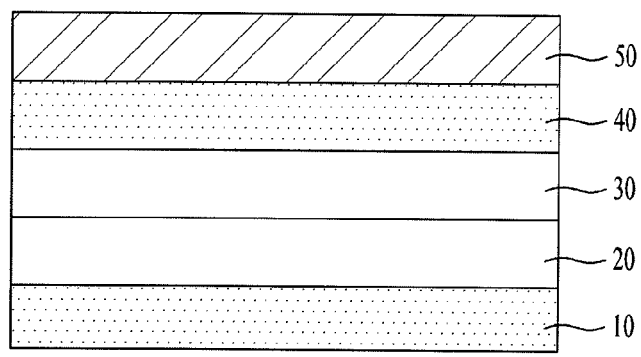
FIG. 1 is a cross-sectional view of an organic light emitting display device of a related art.
Figure 2:
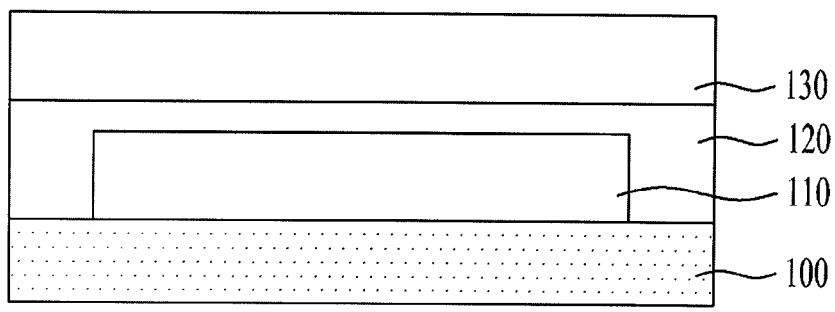
FIG. 2 is a schematic cross-sectional view of an organic light emitting display device according to the invention.

FIG. 2 is a schematic cross-sectional view of an organic light emitting display device according to the invention.

As shown in FIG. 2, the organic light emitting display device according to the invention includes a substrate 100, which may be flexible, an organic light emitting element array 110 disposed on the substrate 100, a polarization plate 130 disposed over the organic light emitting element array 110 and including a first thin-film stacked structure formed of at least one organic film and at least one inorganic film, the organic film and the inorganic film being disposed one on top of the other, and an adhesive layer 120 disposed between the substrate 100 and the polarization plate 130.

The first thin-film stacked structure is formed on one surface of the polarization plate 130 or internally formed within the polarization plate 130.

The organic light emitting element array 110 includes a plurality of organic light emitting elements formed on respective pixels which are defined as a matrix.

Further, a thin film transistor array may be formed on the substrate 100 for driving the organic light emitting elements. Each cathode of the organic light emitting elements is connected to each thin film transistor of the thin film transistor array.

The substrate 100 is flexible so as to be bent or rolled, so that an organic light emitting display device having the flexible substrate 100 can be easily carried and a shape of the organic light emitting display device is variable according to user's needs. Also, when an organic light emitting display device has a large area, and the device is positioned stationary on a wall or a predetermined surface, it is possible to enhance visibility or visual depth perception thereof by controlling a distance between sides of the organic light emitting display device and a viewer. That is, the sides of the organic light emitting display device may be bent towards the viewer.

The polarization plate 130 has a first thin-film stacked structure to prevent external moisture and/or air from invading the organic light emitting element array 110. Encapsulating the organic light emitting element array 110 with the polarization plate 130 is processed by interposing the adhesive layer 120 between the polarization plate 130 and the substrate 100 having the organic light emitting element array 110, after the polarization plate 130 is provided to include the first thin-film stacked structure. In this instance, encapsulation is possible by simply attaching the polarization plate 130 to the substrate 100. Also, an additional encapsulation may be omitted.

The adhesive layer 120 has an adhesive property and is made of a material which may strongly prevent moisture penetration.

In some instances, when the organic light emitting display device is not flexible, the substrate 100 can be made of a glass substrate.

Hereinafter, an organic light emitting display device and a method of manufacturing the same according to specific embodiments of the invention will be described in detail with reference to the accompanying drawings.

Figure 3:
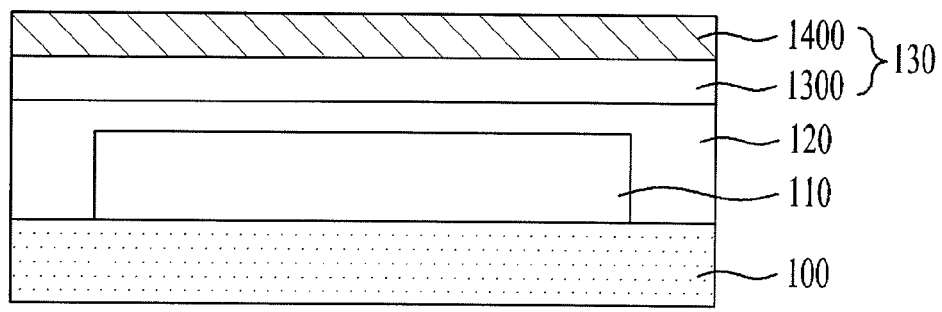
FIG. 3 is a schematic cross-sectional view of an organic light emitting display device according to a first embodiment of the invention.
Figure 4A:
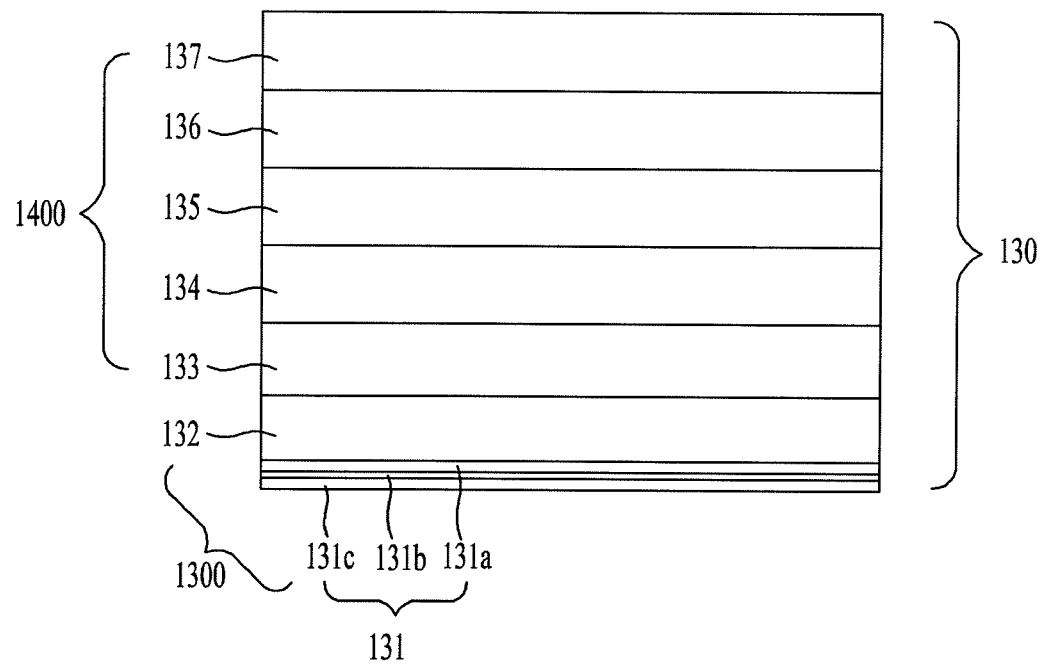
FIG. 4A is a cross-sectional view of a polarization plate of FIG. 3.
Figure 4B:
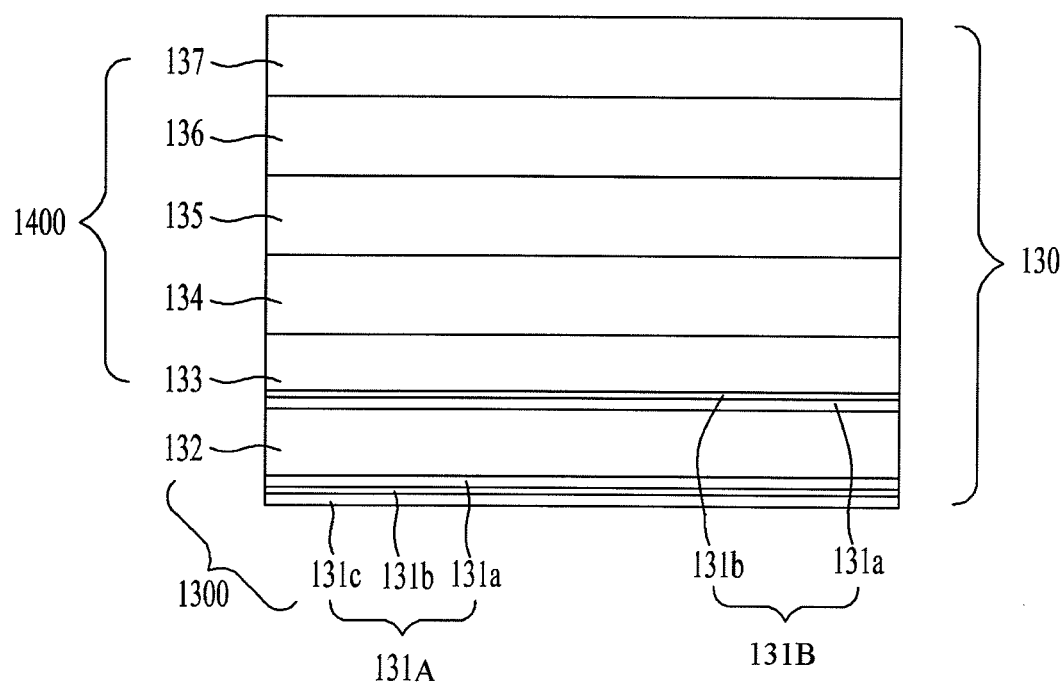
FIG. 4B is a modified embodiment of FIG. 4A.

FIG. 3 is a schematic cross-sectional view of an organic light emitting display device according to a first embodiment of the invention, FIG. 4A is a cross-sectional view of a polarization plate of FIG. 3, and FIG. 4B is a modified embodiment of FIG. 4A.

As shown in FIG. 3 and FIG. 4A, the organic light emitting display device according to the first embodiment of the invention includes a substrate 100, which may be flexible, an organic light emitting element array 110 disposed on the substrate 100, a polarization plate 130 disposed over the organic light emitting element array 110 and including a first thin-film stacked structure 131 formed of at least one organic film and at least one inorganic film, the organic film and the inorganic film being disposed one on top of the other, the first thin-film stacked structure 131 facing the organic light emitting element array 110, and an adhesive layer 120 disposed between the substrate 100 and the polarization plate 130. The first thin-film stacked structure 131 covers the organic light emitting element array 110, interposing the adhesive layer 120 therein.

The polarization plate 130 includes a retarder 1300 having the first thin-film stacked structure 131 and a quarter wave plate (λ/4 plate) 132 disposed on the first thin-film stacked structure 131; and a linear polarization layer 1400 disposed on the quarter wave plate 132 of the retarder 1300.

The first thin-film stacked structure 131 disposed beneath the quarter wave plate 132 is formed of at least one organic film and at least one inorganic film. Herein, the organic film and the inorganic film are alternately disposed. In one example embodiment as shown in FIG. 4A, the first thin-film stacked structure 131 is formed of a stack of an organic film 131a, an inorganic film 131b and an organic film 131c in this order. As in FIG. 4A, preferably, both the lowest and highest films of the first thin-film stacked structure 131 are made of an organic film. A reason why the highest film of the first thin-film stacked structure 131 being in contact with the quarter wave plate 132 is made of an organic film is that its surface of the organic film may be smoothly formed, although a lower surface of the quarter wave plate 132 facing the highest film is uneven. A reason why the lowest film of the first thin-film stacked structure 131 is made of an organic film is that an organic film than an inorganic film may be more reliably adhered to the adhesive layer 120. The first thin-film stacked structure 131 formed of an alternate stack with at least one organic film and at least one inorganic film may be used to protect the polarization plate 130 when sealing the organic light emitting element array 110. The first thin-film stacked structure 131 may be formed by vaporizing and applying organic solvent on the quarter wave plate 132 as a base substrate wound around a roll and curing the applied solvent and then depositing an inorganic film using a sputtering method.

The inorganic film 131b may effectively prevent external moisture and/or air from invading the organic light emitting element array 110. The organic films 131a and 131c may enable the first thin-film stacked structure 131 to have a proper thickness so as to protect the organic light emitting element array 110 from foreign substances generated during manufacture of the organic light emitting display device and thus to prevent deterioration of the organic light emitting element array 110 due to the foreign substances.

Meanwhile, as shown in FIG. 4B, in addition to a first thin-film stacked structure 131A, a second thin-film stacked structure 131B formed of at least one organic film 131b and at least one inorganic film 131a, the organic film and the inorganic film being disposed one on top of the other, may be disposed between the quarter wave plate 132 and the linear polarization layer 1400 in other embodiments. For slimness of the second thin-film stacked structure 131B, the second thin-film stacked structure 131B may be preferably formed as a stack of only one inorganic film and one organic film, disposed on an opposite side of the quarter wave plate 132 from the first thin-film stacked structure 131A. Replacing the second thin-film structure 131B, at least one of an organic film 131a or an inorganic film 131b may be disposed on an opposite side of the quarter wave plate 132 from the first thin-film stacked structure 131A. As shown in FIGS. 4A and 4B, each of the organic films 131a and 131c may have a thickness of about 0.2 μm to 0.5 μm, while the inorganic film 131b may have a thickness of about 0.05 μm to 0.35 μm. The first thin-film stacked structure 131 (or 131A) including at least one organic film 131a and at least one inorganic film 131b, the organic film 131a and the inorganic film 131b being disposed one on top of the other, may have a thickness equal to or larger than about 3 μm. The second thin-film stacked structure 131B, if necessary or desired, may have the same or similar configuration as the first thin-film stacked structure 131 in terms of thickness.

The linear polarization layer 1400 may include a PVA (polyvinyl alcohol) layer 135 disposed as a central layer of the linear polarization layer 140 as shown in FIG. 3 and having a light absorption axis in one direction to provide a polarization function; first and second TAC (triacetyl cellulose) layers 134 and 136 respectively disposed on lower and upper surfaces of the PVA layer 135; a hard coating layer 137 disposed on the second TAC layer 136 to protect the underlying layers; and an adhesive layer 133 disposed beneath the first TAC layer 134 to adhere the first TAC layer 134 to the quarter wave plate 132. The adhesive layer 133 may be omitted, if one surface of the linear polarization layer 1400 has an adhesive property.

The linear polarization layer 1400 may have a total thickness of about 60 μm to 100 μm.

Also, the retarder 1300 having the first thin-film stacked structure 131 and the quarter wave plate (λ/4 plate) 132 may have a thickness of about 50 μm to 80 μm.

The quarter wave plate 132 may be formed of a stack consisting of two eighth wave (λ/8) plates.

The quarter wave plate 132 may be made of a material having a reflection rate equal to or less than 5% in a wavelength range of 400 nm to 500 nm (referred to as a short wavelength range) so as to effectively receive external light.

A retardation value of the quarter wave plate 132 may be in a range of 138 nm to 148 nm.

The quarter wave plate 132 may have a moisture permeability equal to or less than $10^{-3}$ g/m²·day so as to effectively prevent a moisture from invading the organic light emitting element array 110 in cooperation with the first thin-film stacked structure 131.

Herein, the substrate 100 may include a given substrate and a thin film transistor array disposed on the substrate. The given substrate may be any one of a plastic thin film, a thin film glass and a metal foil and may have a thickness equal to or less than 0.2 mm. The substrate 100 may be flexible by use of a material that allows the substrate to be bendable and to have no crack when the substrate is recovered to a flat state from a bent state.

Meanwhile, if the substrate 100 is flexible, the substrate 100 may be thermally expanded under a condition, such as when heat is applied to an equipment for deposition or patterning during an array formation process of forming the organic light emitting element array 110 on the substrate 100, and thus, the process may be not normally carried out. In order to prevent such a problem, the substrate 100 is fixed on a glass substrate by interposing buffer layers or etch stopper layers between the glass substrate and the substrate 100 before formation of the organic light emitting element array 110, and array formation is substantially achieved by loading the glass substrate with a deposition or patterning equipment. After completing the formation of the light emitting organic array 150 or/and attaching the polarization plate 130 to the substrate 100 having the organic light emitting element array 110, the glass substrate is removed from the flexible substrate 100.

Figure 5:
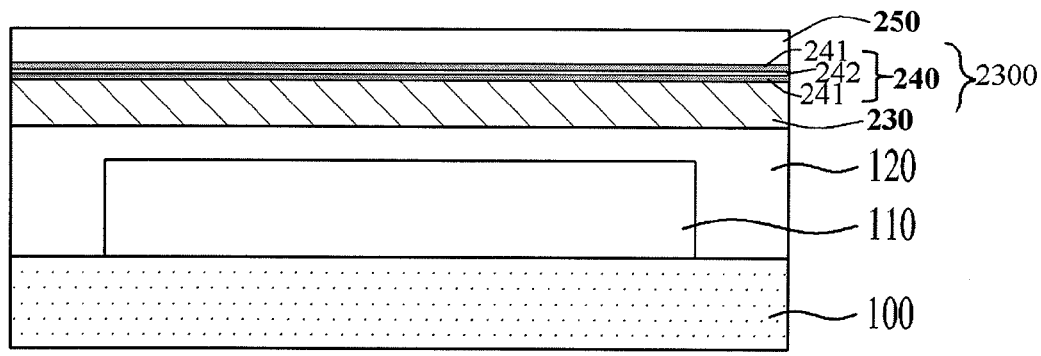
FIG. 5 is a schematic cross-sectional view of an organic light emitting display device according to a second embodiment of the invention.

FIG. 5 is a schematic cross-sectional view of an organic light emitting display device according to a second embodiment of the invention.

As shown in FIG. 5, the organic light emitting display device according to the second embodiment of the invention includes a substrate 100, an organic light emitting element array 110 disposed on the substrate 100, a polarization plate 2300 disposed over the organic light emitting element array 110, and an adhesive layer 120 disposed between the substrate 100 and the polarization plate 2300. The polarization plate 2300 includes a circular polarizer 230 and a first thin-film stacked structure 240 formed of at least one of an organic film 241 and an inorganic film 242. Herein, the adhesive layer 120 fully covers the organic light emitting element array 110.

As shown in FIG. 5, the polarization plate 2300 may further include a transparent optical film 250 on an outermost surface. The transparent optical film 250 may be polyethylene terephthalate (PET).

The transparent optical film 250 is flat and optically has an isotropic property. Preferably, the first thin-film stacked structure 240 may be directly coated or deposited on the transparent optical film 250, and then a circular polarizer 230 and the transparent optical film 250 may be attached each other by an adhesive layer which is on one surface of the circular polarizer 230. Because the circular polarizer 230 is already optically treated to have a circular polarizing characteristic and the surface of the circular polarizer 230 is rough, directly coating an organic film or an inorganic film to the circular polarizer 230 is not stably processed. With respect to a coating rate and a yield, directly coating or depositing the first thin-film stacked structure 240 on the transparent optical film 250 is preferred.

In some instances, in addition to a first thin-film stacked structure 240, a second thin-film stacked structure formed of at least one organic film and at least one inorganic film, the organic film and the inorganic film being disposed one on top of the other, may be further disposed on an opposite side of the transparent optical film 250 from the first thin-film stacked structure 240. On the other hand, at least one of an organic film or an inorganic film may be disposed on an opposite side of the transparent optical film 250 from the first thin-film stacked structure 240.

The first thin-film stacked structure 240 under the transparent optical film 250 faces the circular polarizer 230. Even though the transparent optical film 250 optically has an anisotropic property, the transparent optical film 250 is outwardly disposed over the circular polarizer 230. So once an external light is incident upon the circular polarizer 230, polarization may stably operate as appropriate and the polarization remains beneath the transparent optical film 250.

The circular polarizer 230 has a circular polarization characteristic. Through the circular polarizer 230, the X-axis oscillation component having the $\lambda/4$ delayed phase and the Y-axis oscillation component having no phase shift are combined in a vector manner to generate circularly polarized light. Herein, the circular polarizer 230 has a function equal to the stack of a linear polarization layer and a quarter wave plate described in the first embodiment.

The transparent optical film 250 may have a thickness of about 10 μm to 90 μm. Preferably, the transparent optical film 250 may have a thickness of about 50 μm.

Also, the circular polarizer 230 may have a total thickness of about 60 μm to 100 μm.

Figure 6:
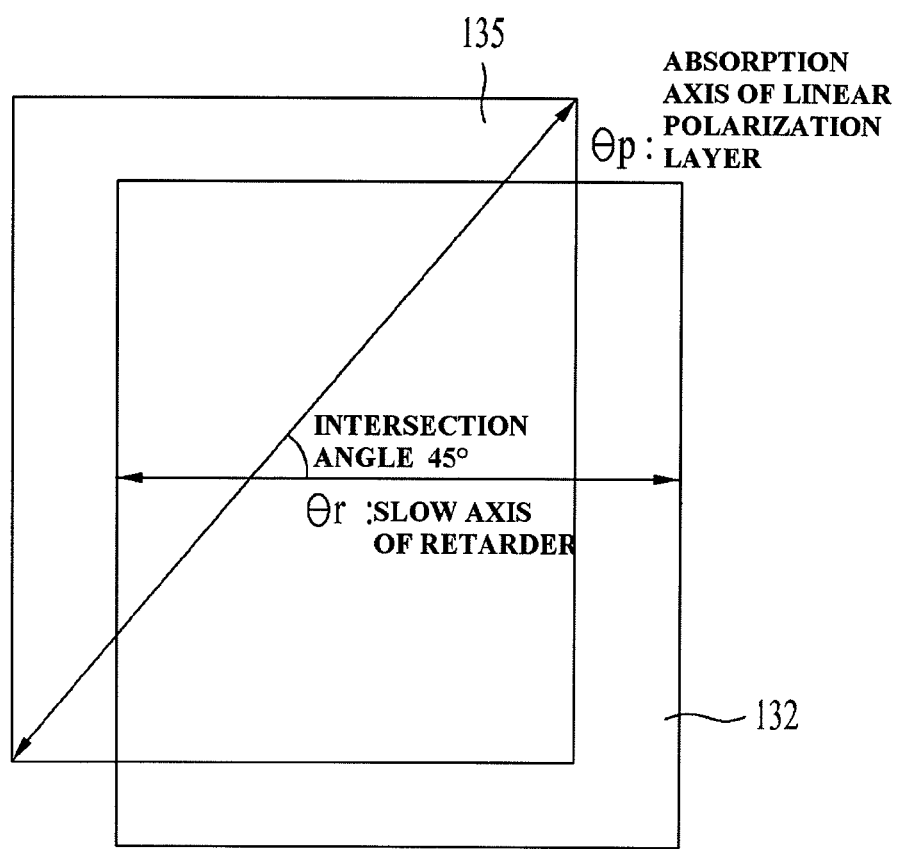
FIG. 6 illustrates a relationship between a light absorption axis of a linear polarization layer and a slow axis of a retarder of FIG. 3.

FIG. 6 illustrates a relationship between a light absorption axis of the linear polarization layer and a slow axis of the retarder of FIG. 3.

As shown in FIG. 6, the absorption axis θp of the PVA layer 135 of the linear polarization layer 1400 is at +45° angle with respect to the slow axis θr of the quarter wave plate 132 of the retarder 1300. In the linear polarization layer 1400, the PVA layer 135 functions as an optical layer. Thus, the absorption axis of the PVA layer 135 becomes an absorption axis of the linear polarization layer 1400. Alternatively, the absorption axis θp of the PVA layer 135 of the linear polarization layer 1400 is at −45° angle with respect to the slow axis θr of the quarter wave plate 132 of the retarder 1300.

The absorption axis of the linear polarization layer 1400 has a single direction. When light is incident upon the PVA layer 135 of the linear polarization layer 1400 (through the hard coating layer 137), light is divided into two perpendicular X-axis and Y-axis oscillation components. In this instance, the X-axis is at −45° angle with respect to the absorption axis while the Y-axis is at +45° angle with respect to the absorption axis or vice versa. In this example, it is assumed that the X-axis is at −45° angle with respect to the absorption axis while the Y-axis is at +45° angle with respect to the absorption axis. Therefore, when the X-axis oscillation component of light propagates and encounters with the slow axis of the quarter wave plate 132, so that the X-axis oscillation component of light has a $\lambda/4$ delayed phase. As a result, the X-axis oscillation component having the $\lambda/4$ delayed phase and the Y-axis oscillation component having no phase shift are combined in a vector manner to generate circularly polarized light. That is, linearly polarized light is converted into circularly polarized light.

Figure 8:
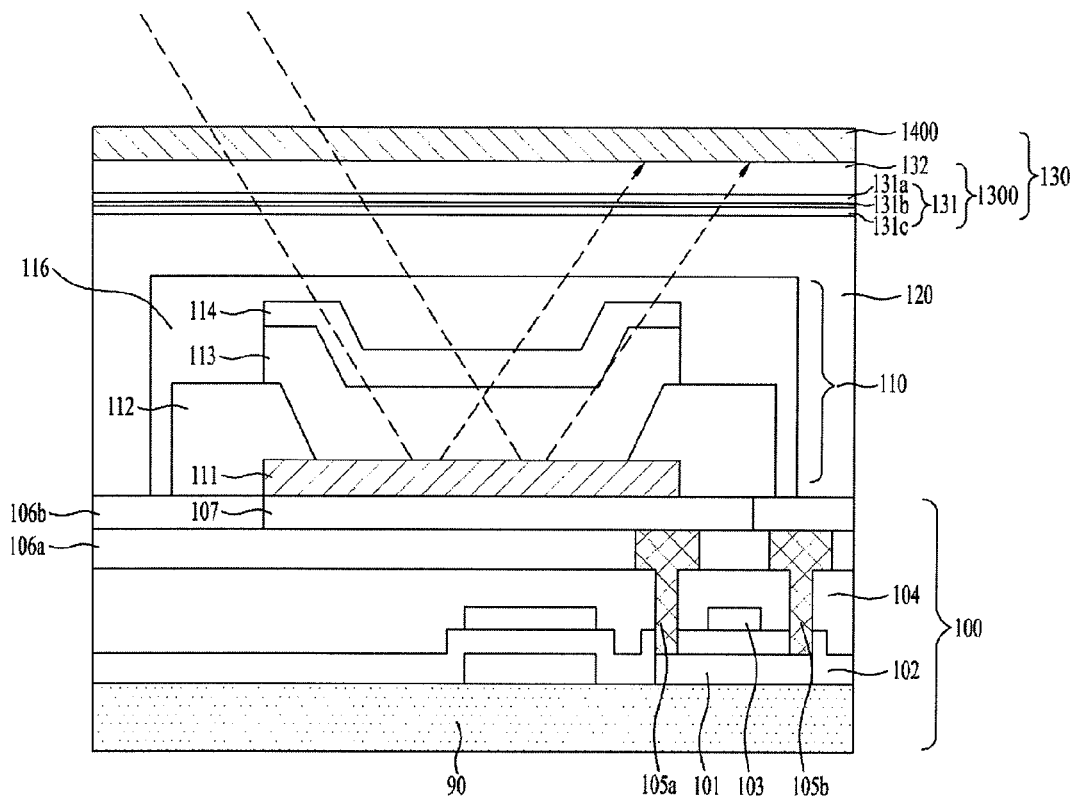
FIG. 8 is a cross-sectional view illustrating an inner configuration of an organic light emitting display device according to the first embodiment of the invention.

Meanwhile, in the organic light emitting display device according to one example embodiment of the invention, as shown in FIG. 8, a reflective anode 111 is disposed in the organic light emitting element array 110. Thus, the circularly polarized light is incident upon the organic light emitting element array 110 and then is reflected from the reflective anode 111 and in turn is again incident upon the quarter wave plate 132. At this time, the X-axis oscillation component of the circularly polarized light is further retarded by a $4/\lambda$ phase. Thus, the X-axis oscillation component of light emitted from the quarter wave plate 132 has a $2/\lambda$ delayed phase relative to an original phase of the X-axis oscillation component. In this manner, a vector combination of the X-axis oscillation component and the Y-axis oscillation component of light emitted from the quarter wave plate 132 corresponds to the absorption axis of the linear polarization layer 1400, thereby prohibiting incident light (i.e., the circularly polarized light) from being emitted out of the linear polarization layer 1400. With this, the polarization plate 130 may visually block influence of ambient light which may be incident upon the organic light emitting display device via scattering and/or random reflection.

Figure 7A:
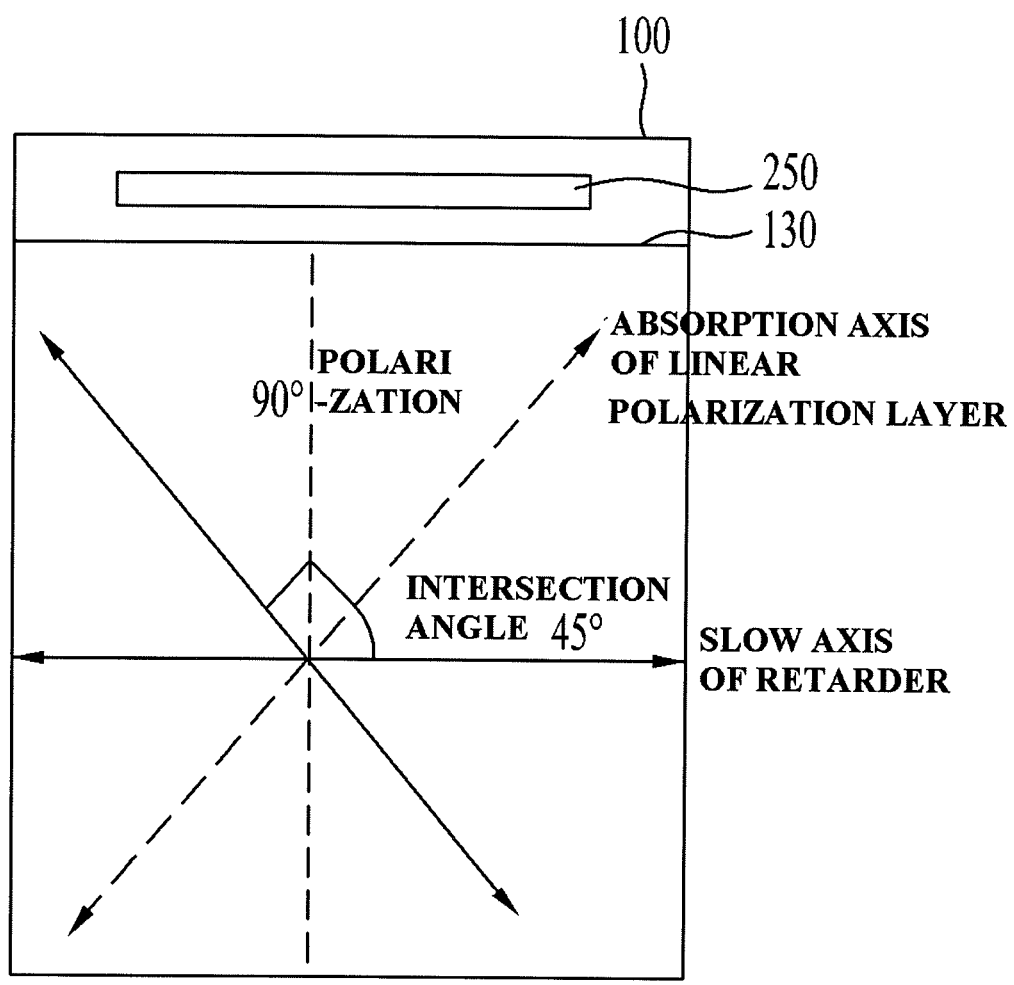
FIG. 7A and FIG. 7B respectively illustrate phases of light when passing through a linear polarization layer and a retarder in an organic light emitting display device according to various example embodiments of the invention.
Figure 7B:
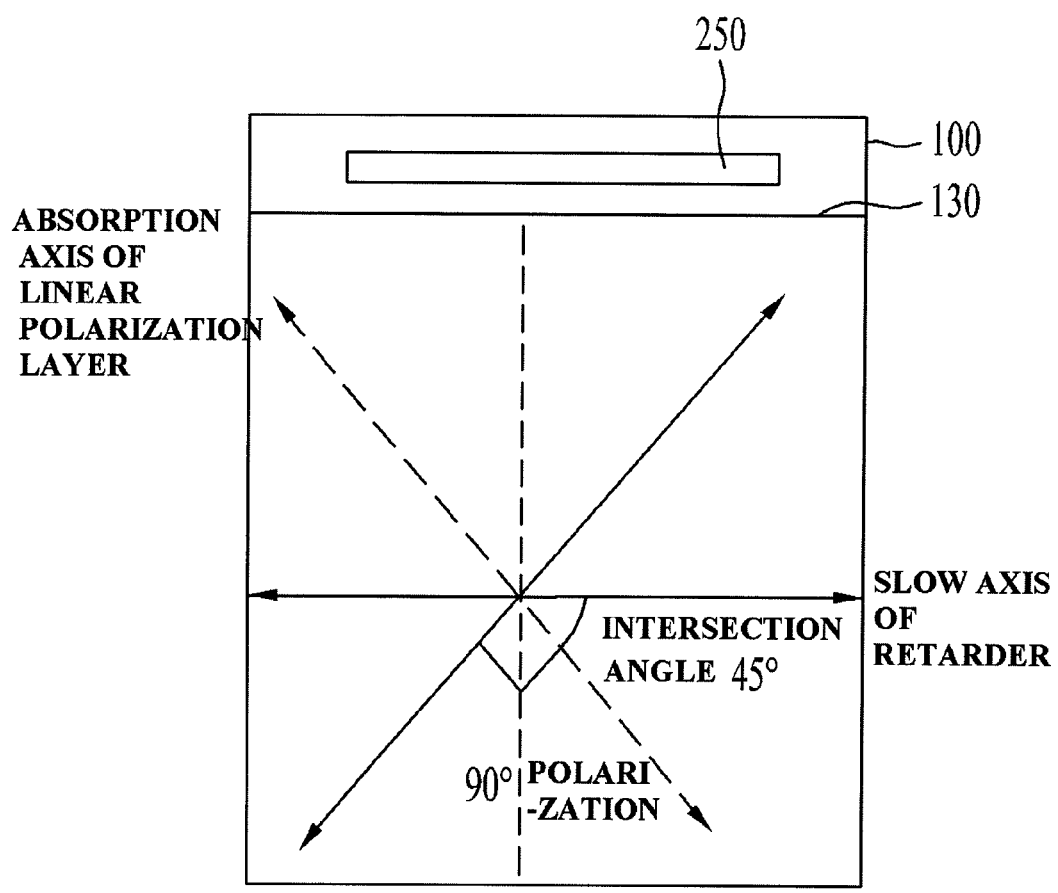

FIG. 7A and FIG. 7B respectively illustrate phases of light when passing through a linear polarization layer and a retarder in an organic light emitting display device according to various embodiments of the invention.

In the embodiment as shown in FIG. 7A, an absorption axis of a linear polarization layer is at +45° angle with respect to a slow axis of a quarter wave plate of a retarder. In FIG. 7A, an axis being at +90° angle with respect to the absorption axis of the linear polarization layer represents a retardation effect of the quarter wave plate of the retarder. That is, when the absorption axis of the linear polarization layer is at +45° angle with respect to the slow axis of the quarter wave plate of the retarder, light passing through the linear polarization layer and the retarder has a light path shift in which a light path rotates or shift with respect to the slow axis of the retarder by +135° or −45° angle.

In the embodiment as shown in FIG. 5B, an absorption axis of a linear polarization layer is at +135° or −45° angle with respect to a slow axis of a quarter wave plate of a retarder. In FIG. 5B, an axis being at +90° angle with respect to the absorption axis of the linear polarization layer represents a retardation effect of the quarter wave plate of the retarder.

That is, when the absorption axis of the linear polarization layer is at +135° or −45° angle with respect to the slow axis of the quarter wave plate of the retarder, light passing through the linear polarization layer and the retarder has a light path shift in which a light path rotates or shift with respect to the slow axis of the retarder by −135° or +45° angle.

As seen from FIG. 7A and FIG. 7B, the polarization plate 130 is formed by attaching the linear polarization layer 1400 to the retarder 1300 so that the absorption axis of the linear polarization layer 1400 is at +45° or −45° angle with respect to the slow axis of the quarter wave plate 132 of the retarder 1300.

Meanwhile, under the polarization plate 130, the organic light emitting element array is disposed on the substrate 100. Beneath the organic light emitting element array, a thin film transistor array is disposed to be electrically connected to an anode of the organic light emitting display array.

In FIG. 7A and FIG. 7B, reference numeral 250 indicates a drive unit to drive the thin film transistor array.

Now, detailed configurations of the substrate and the organic light emitting display array disposed on the substrate will be described with reference to the accompanying drawings.

FIG. 8 is a cross-sectional view illustrating an inner configuration of an organic light emitting display device according to the first embodiment of the invention.

As shown in FIG. 8, the organic light emitting display device according to one example embodiment of the invention includes a substrate 90, a thin film transistor array disposed on the substrate 90, an organic light emitting element array 110 disposed on the thin film transistor array, and a polarization plate 130 disposed over the organic light emitting element array 110 while being disposed opposite to the substrate 90 in the structure. An adhesive layer 120 is disposed between the substrate 90 and the polarization plate 130 and between the organic light emitting element array 110 and the polarization plate 130.

Herein, the substrate 100 may include the substrate and the thin film transistor array disposed on the substrate 90.

The thin film transistor array may include a semiconductor layer 101 partially or locally disposed on the substrate 90, a first insulation film 102 to cover both the semiconductor layer 101 and the substrate 90, a gate electrode 103 disposed over a central region of the semiconductor layer 101, a gate insulation film 104 to cover both the gate electrode 103 and the first insulation film 102, source and drain electrodes 105b and 105a respectively disposed in recesses in the first insulation film 102 and the gate insulation film 104 so as to be in respective contacts with both sides of an upper portion of the semiconductor layer 101, a second insulation film 106a disposed on the gate insulation film 104 so as to be adjacent to the source and drain electrodes 105b and 105a, a contact electrode 107 disposed on the second insulation film 106a while being in contact with the drain electrode 105a, and a third insulation film 106b disposed on the second insulation film 106a so as to be adjacent to the contact electrode 107.

Although, in this embodiment, the second and third insulation films 106a and 106b are formed as a separate film, the second and third insulation films 106a and 106b may be integrated into a single film 106.

There may be further disposed a gate metal pattern partially overlapping with the contact electrode 107 and formed at the same layer (or the same layer level) as the gate electrode 103. In this overlapping region, a storage capacitor may be defined. This gate metal pattern may be eliminated or not used.

There may be further disposed a semiconductor pattern formed at the same layer (or the same layer level) as the semiconductor layer so as to correspond to the gate metal pattern. This semiconductor pattern may be eliminated or not used.

The thin film transistor array may include a gate line extending in one direction and being connected to the gate electrode 103, and a data line extending in a perpendicular manner to the gate line and being connected to the source electrode 105b.

The organic light emitting element array 110 may include a plurality of pixel regions on a matrix, each pixel region including one organic light emitting element. The organic light emitting element, as shown in FIG. 6, may include an anode ill in contact with the contact electrode 107, a light emitting layer 113 and a cathode 114.

The plurality of pixel regions is separated from each other using a bank 112.

The anode 111 is made of a reflective metal to reflect external light incident thereupon.

The organic light emitting element array 110 may further include an inorganic protective film 116 encapsulating the anode 111, the bank 112, the light emitting layer 113 and the cathode 114. The inorganic protective film 116 may be eliminated or not used if necessary or desired.

The polarization plate 130 is disposed such that the first thin-film stacked structure 131 thereof faces away from the organic light emitting element array 110. The adhesive layer 120 is disposed between the substrate 100 and the polarization plate 130 and particularly between the organic light emitting element array 110 and the polarization plate 130, thereby sealing the organic light emitting element array 110.

Figure 9:
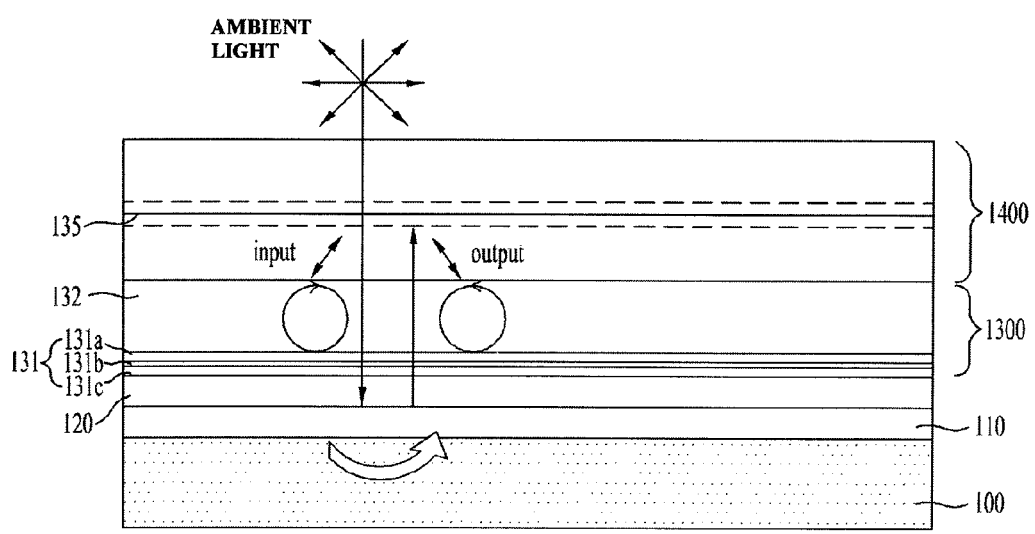
FIG. 9 illustrates how ambient or external light incident upon a light emitting display device according to one example embodiment of the invention is prevented or reduced from being again reflected therefrom.

FIG. 9 illustrates how ambient or external light incident upon a light emitting display device according to the first embodiment of the invention is prevented or reduced from being again reflected therefrom.

As shown in FIG. 9, ambient or external light incident upon the light emitting display device, first, passes through the linear polarization layer 1400 having a light absorption axis in a single direction. When external light is incident upon the PVA layer 135 of the linear polarization layer 1400 (through the hard coating layer 137, see FIG. 3), a light transmission axis of the PVA layer 135 (corresponding to a vector combination of two perpendicular X-axis and Y-axis oscillation components of light) is formed to be substantially perpendicular to the light absorption axis. Then, external light is emitted in accordance with the light transmission axis from the linear polarization layer 1400 and incident upon the quarter wave plate 132 (referred to as an input polarized state of light). When light encounters with the quarter wave plate 132, light is right-circularly polarized. Next, the right-circularly polarized light is incident upon the reflective anode 111 of the organic light emitting element array 110 and is reflected therefrom to be inverted to left-circularly polarized light. The left-circularly polarized light is again incident upon the quarter wave plate 132. When the left-circularly polarized light encounters with the quarter wave plate 132, a vector combination of two perpendicular X-axis and Y-axis oscillation components of light is changed to be perpendicular to the light transmission axis of the linear polarization layer 1400 (referred to as an output polarized sate of light). Thereafter, light in the output polarized state is incident upon the PVA layer 135. At this time, since a vector combination of two perpendicular X-axis and Y-axis oscillation components of light in the output polarized state corresponds to the light absorption axis of the PVA layer 135, external light is finally absorbed by the PVA layer 135. In this way, ambient or external light incident upon the light emitting display device may be prevented or reduced from being again reflected (or re-reflected) therefrom.

Hereinafter, a method of manufacturing a light emitting display device according to one embodiment of the invention, especially, a method of manufacturing a first thin-film stacked structure on a quarter wave plate will be described in detail.

Figure 10:
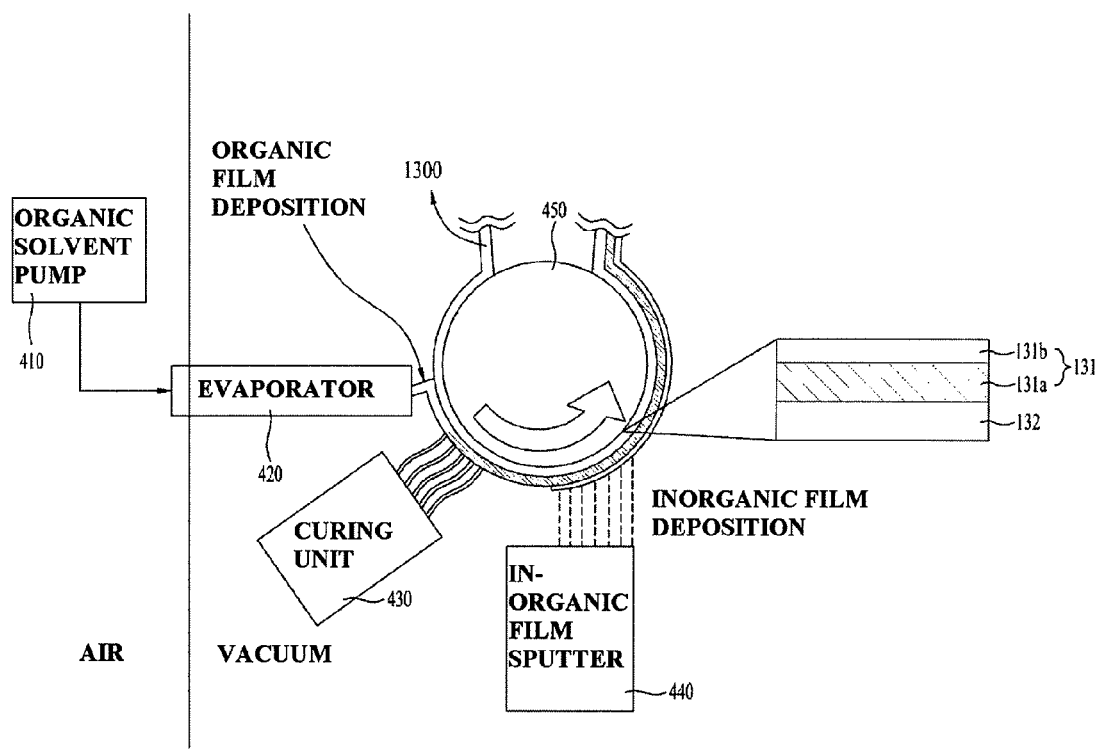
FIG. 10 illustrates a process of manufacturing a first thin-film stacked structure of a light emitting display device according to the first embodiment of the invention.

FIG. 10 illustrates a process of manufacturing a first thin-film stacked structure of a light emitting display device according to the first embodiment of the invention.

As shown in FIG. 10, a quarter wave plate 132 having the above mentioned moisture permeability, reflection rate, retardation value, and thickness is provided as a base substrate on a coating roll 450. At this time, the quarter wave plate 132 may be provided in a wound state around the roll 450. In this way, a process of forming organic and inorganic films on the quarter wave plate 132 may be carried out in a roll to roll manner.

Organic solvent supplied from an organic solvent pump 410 is vaporized using an evaporator 420 and is applied to the quarter wave plate 132 as a base substrate wound around the coating roll 450. The applied organic solvent is heat dried using a curing unit 430 to form an organic film 131a of a first thin-film stacked structure 131.

An inorganic film 131b of the first thin-film stacked structure 131 is deposited on the organic film 131a using an inorganic film sputter 440.

In FIG. 10, the organic film 131a is directly formed on the quarter wave plate 132. This is because the organic film 131a may be formed to have a sufficient thickness to achieve a smooth exposed surface thereof, although a contact surface of the quarter wave plate 132 facing the organic film 131a is uneven. In some instances, as in FIGS. 4A and 4B, another organic film 131c may be formed on the inorganic film 131b.

In this way, the first thin-film stacked structure 131 is formed on the quarter wave plate 132. The first thin-film stacked structure 131 may have at least one organic film and at least one inorganic film, and the organic film and the inorganic film are disposed one on top of the other.

During this process, a second thin-film stacked structure (131B shown in FIG. 4B) may be formed on the other surface of the quarter wave plate 132. The second thin-film stacked structure 131B may have at least one organic film and at least one inorganic film, the organic film and the inorganic film are disposed one on top of the other.

During this process, the organic solvent pump 410 is placed in an atmospheric pressure state, while the evaporator 420, the curing unit 430, the inorganic film sputter 440 and the coating roll 450 are disposed inside a vacuum chamber.

Meanwhile, in the second embodiment, the first thin-film stacked structure 240 maybe on the transparent optical film 250 as shown in FIG. 5.

After the first thin-film stacked structure 131 is formed on the quarter wave plate 132, the resultant structure is flipped upside down. A quarter wave plate 132 (refer to FIG. 4) having the first thin-film stacked structure 131 is adhered on the substrate 100 using an adhesive layer 120 so that the first thin-film stacked structure 131 and the organic light emitting element array 110 face each other.

Then, the substrate 100 and the quarter wave plate 132 are attached to each other so that the organic light emitting element array 110 is fully covered by the first thin-film stacked structure 131. In this way, the organic light emitting element array 110 is encapsulated.

Then, an opposite side of the quarter wave plate 132 from the first thin-film stacked structure 131 is attached to the linear polarization layer 1400. At this time, an adhesive layer may be disposed between the linear polarization layer 1400 and the quarter wave plate 132. Thus, the polarization plate 130 is defined as a stacking of the linear polarization layer 1400 and the retarder 1300.

In this instance, the polarization plate 130 is disposed toward a substrate 100 on which an organic light emitting element array 110 is formed. At this time, the first thin-film stacked structure 131 of the polarization plate 130 faces away from the organic light emitting element array 110.

In the method of manufacturing the organic light emitting display device according to one embodiment of the invention, a plastic thin film having an anisotropic property is excluded in a sealing process, and sealing organic and inorganic thin films are formed on one side surface or both side surfaces of a retarder of a polarization plate, and the polarization plate is attached to a substrate on which an organic light emitting element array is formed, with an adhesive layer interposed therebetween, to encapsulate the organic light emitting element array.

Since the plastic thin film having an anisotropic property is absent between the polarization plate and the substrate, external light is not visible to a viewer of the display device. That is, the sealing organic and inorganic thin films are formed to be integrated with the polarization plate and, thus, an additional plastic thin film may be eliminated between the organic light emitting element array and the polarization plate. As a result, polarization characteristic to the external light may be valid.

Further, the sealing organic and inorganic thin films are formed to be integrated with the polarization plate and, thus, additional films necessary in the encapsulation process of a related art device may be eliminated. Further, a glass substrate which is necessary in the above-described encapsulation process using the glass may be eliminated. Therefore, the display device has a greatly-reduced thickness, to provide the display device with improved bendability.

Furthermore, since the sealing organic and inorganic thin films are formed to be integrated with a retarder of the polarization plate, a sealing structure may be simplified. That is, the sealing organic and inorganic thin films are formed on the retarder in a roll to roll manner, to allow an adhesive layer to be eliminated between the retarder and the sealing organic and inorganic thin films and, further, the additional films necessary are the encapsulation process of the related art may be eliminated, thereby achieving a simple encapsulation structure.

Moreover, the sealing organic and inorganic thin films are formed to be integrated with the polarization plate, to allow the polarization characteristics of the polarization plate to be maintained. Therefore, an ambient contrast ratio (ACR) may be ensured to have a sufficient level, so that, when ambient or external light is present, the display device may maintain high visual performance.

It will be apparent to those skilled in the art that various modifications and variations can be made in the invention without departing from the spirit or scope of the inventions. Thus, it is intended that the invention covers the modifications and variations of this invention provided they come within the scope of the appended claims and their equivalents.

What is claimed is:

1. An organic light emitting display device comprising:
   a substrate;
   an organic light emitting element array disposed on the substrate;
   a polarization plate disposed over the organic light emitting element array and including a first thin-film stacked structure formed of at least one of an organic film and an inorganic film, a quarter wave plate ($\lambda/4$ plate) disposed on the first thin-film stacked structure; and a linear polarization layer disposed on the quarter wave plate; and
   an adhesive layer disposed between the substrate and the polarization plate, wherein the adhesive layer covers the organic light emitting element array, and wherein the at least one of the organic film and the inorganic film is in contact with the adhesive layer.

2. The device of claim 1, wherein the polarization plate further comprises a second thin-film stacked structure disposed on an opposite side of the polarization plate from the first thin-film stacked structure, and formed of at least one organic film and at least one inorganic film, the at least one organic film and the at least one inorganic film of the second thin-film stacked structure being disposed one on top of the other.

3. The device of claim 1, wherein the polarization plate further comprises a second thin-film stacked structure formed of at least one of an organic film or an inorganic film.

4. The device of claim 1, wherein the first thin-film stacked structure faces the organic light emitting element array.

5. The device of claim 1, wherein the organic film of the first thin-film stacked structure is in contact with the quarter wave plate.

6. The device of claim 1, wherein the polarization plate further comprises a second thin-film stacked structure disposed between the quarter wave plate and the linear polarization layer, wherein the second thin-film stacked structure is formed of at least one organic film and at least one inorganic film, the at least one organic film and the at least one inorganic film of the second thin-film stacked structure are disposed one on top of the other.

7. The device of claim 1, wherein the polarization plate further comprises a second thin-film stacked structure disposed between the quarter wave plate and the linear polarization layer, wherein the second thin-film stacked structure is formed of at least one of an organic film or an inorganic film.

8. The device of claim 1, wherein a total thickness including the quarter wave plate and the first thin-film stacked structure is about 50 μm to 80 μm.

9. The device of claim 1, wherein an absorption axis of the linear polarization layer is at +45° or −45° angle with respect to a slow axis of the quarter wave plate.

10. The device of claim 1, wherein the quarter wave plate is formed of a stack consisting of two eighth wave plates ($\lambda/8$ plates).

11. The device of claim 1, wherein the quarter wave plate is made of a material having a reflection rate equal to or less than 5% in a wavelength range of 400 nm to 500 nm.

12. The device of claim 1, wherein a retardation value of the quarter wave plate is in a range of 138 nm to 148 nm.

13. The device of claim 1, wherein the substrate comprises any one of a plastic thin film, a thin film glass and a metal foil, each having a thickness equal to or less than 0.2 mm.

14. The device of claim 13, wherein the quarter wave plate has a moisture permeability equal to or less than $10^{-3}$ g/m²·day.

15. The device of claim 1, wherein the at least one organic film includes a first and second organic films so that the at least one inorganic film is disposed in between the first and second organic films.

16. The device of claim 1, wherein an incident light that obtains a first circular polarization in passing through the polarization plate, obtains a second circular polarization opposite to the first circular polarization upon reflection off the substrate, and is absorbed into the polarization plate.

17. The device of claim 1, wherein the substrate is flexible.

18. An organic light emitting display device comprising:
   a substrate;
   an organic light emitting element array disposed on the substrate;
   a polarization plate disposed over the organic light emitting element array and including a thin-film stacked structure formed of at least one organic film and at least one inorganic film, the at least one organic film and the at least one inorganic film being disposed one on top of the other, a quarter wave plate ($\lambda/4$ plate) disposed on the first thin-film stacked structure; and a linear polarization layer disposed on the quarter wave plate; and
   an adhesive layer disposed between the substrate and the polarization plate, wherein the adhesive layer covers the organic light emitting element array, and wherein the at least one of the organic film and the inorganic film of the thin-film stacked structure is in contact with the adhesive layer.

* * * * *